United States Patent [19]
Koehler et al.

[11] Patent Number: 5,339,051
[45] Date of Patent: Aug. 16, 1994

[54] MICRO-MACHINED RESONATOR OSCILLATOR

[75] Inventors: Dale R. Koehler; Jeffry J. Sniegowski; Hugh M. Bivens; Kurt O. Wessendorf, all of Albuquerque, N. Mex.

[73] Assignee: Sandia Corporation, Albuquerque, N. Mex.

[21] Appl. No.: 39,638

[22] Filed: Mar. 30, 1993

Related U.S. Application Data

[63] Continuation-in-part of Ser. No. 803,815, Dec. 9, 1991, Pat. No. 5,198,716.

[51] Int. Cl.⁵ .................. H03B 5/36; H01L 41/08
[52] U.S. Cl. ......................... 331/65; 331/66; 331/68; 331/74; 331/108 C; 331/116 R; 331/116 FE; 331/158; 310/318; 310/319; 324/652; 324/727; 343/718; 455/92; 455/100; 455/128; 455/129
[58] Field of Search ........ 331/65, 66, 116 R, 116 FE, 331/116 M, 158, 185, D163, 68, 74, 108 C; 310/318, 319; 324/652, 727; 343/718; 455/92, 100, 128, 129

[56] References Cited

U.S. PATENT DOCUMENTS

| | | | |
|---|---|---|---|
| 2,002,167 | 5/1935 | Beckmann | 171/327 |
| 2,161,980 | 6/1939 | Runge et al. | 171/327 |
| 3,988,621 | 10/1976 | Nakayama et al. | 310/9.4 |
| 4,234,811 | 11/1980 | Hishida et al. | 310/348 |
| 4,362,961 | 12/1982 | Gerber | 310/370 |
| 4,445,256 | 5/1984 | Huguenin et al. | 29/25.35 |
| 4,498,344 | 2/1985 | Dinger | 73/778 |
| 4,650,346 | 3/1987 | Tehon | 374/117 |
| 4,735,103 | 4/1988 | Mussard et al. | 73/862.59 |
| 4,764,244 | 8/1988 | Chitty et al. | 156/630 |
| 4,831,304 | 5/1989 | Dorey et al. | 310/311 |
| 4,861,168 | 8/1989 | Ziegler et al. | 374/117 |
| 4,916,413 | 4/1990 | Nakayama et al. | 331/68 |
| 5,048,323 | 9/1991 | Stansfeld et al. | 73/32 |
| 5,075,641 | 12/1991 | Weber et al. | 331/108 C |
| 5,198,716 | 3/1993 | Godshall et al. | 310/349 |
| 5,248,947 | 9/1993 | Shiga | 331/74 X |

Primary Examiner—David Mis
Attorney, Agent, or Firm—Dennis F. Armijo

[57] ABSTRACT

A micro-miniature resonator-oscillator is disclosed. Due to the miniaturization of the resonator-oscillator, oscillation frequencies of one MHz and higher are utilized. A thickness-mode quartz resonator housed in a micro-machined silicon package and operated as a "telemetered sensor beacon" that is, a digital, self-powered, remote, parameter measuring-transmitter in the FM-band. The resonator design uses trapped energy principles and temperature dependence methodology through crystal orientation control, with operation in the 20–100 MHz range. High volume batch-processing manufacturing is utilized, with package and resonator assembly at the wafer level. Unique design features include squeeze-film damping for robust vibration and shock performance, capacitive coupling through micro-machined diaphragms allowing resonator excitation at the package exterior, circuit integration and extremely small (0.1 in. square) dimensioning. A family of micro-miniature sensor beacons is also disclosed with widespread applications as bio-medical sensors, vehicle status monitors and high-volume animal identification and health sensors. The sensor family allows measurement of temperatures, chemicals, acceleration and pressure. A microphone and clock realization is also available.

51 Claims, 16 Drawing Sheets

EAR IMPLANTED ID AND THERMOMETER SENSOR-BEACON

RECEIVER

TIRE IMPLANTED
ID AND PRESSURE
SENSOR-BEACON

MICRO-MACHINED RESONATOR OSCILLATOR

GOVERNMENT RIGHTS

The U.S. Government has rights to this invention pursuant to Contract No. DE-AC04-76DP00789 between the United States Department of Energy and American Telephone and Telegraph Company.

CROSS-REFERENCE TO RELATED APPLICATIONS

This application is a continuation-in-part application of U.S. patent application Ser. No. 803,815 filed Dec. 9, 1991, now U.S. Pat. No. 5,198,716 issued Mar. 30, 1993, entitled "A Micro-Machined Resonator" to Ned A. Godshall et al., the teachings of which are incorporated herein by reference.

BACKGROUND OF THE INVENTION

1. Field of the Invention (Technical Field)

The present invention relates to a quartz resonator and its support structure and more particularly to a hermetically sealed quartz resonator having a micro-machined support structure.

2. Description of the Prior Art

Quartz resonators are used for oscillators or sensing devices. In particular, a quartz resonator can be used as an oscillator for a watch or any other application which requires small size, low cost and ruggedness. The quartz resonator might also be used for microprocessor applications. A quartz resonator operates by resonating in response to a stimulus, which may be a physical event, such as acceleration or force or pressure, or an electrical signal. In the former usage, the resonator acts as a transducer, and in the latter case, the resonator acts as a frequency source.

Previous technology for resonator support structures is varied and includes features which minimize the effects tending to restrict motion of the resonating surface resulting from physically holding the vibrating resonator body. To this end, the support is usually placed at a vibrational node of the resonator body. With discs operating in radial extension modes, attachment at the center of the disc is a conventional technique for support.

For shear mode type resonators with little vibrational motion normal to the plane of the resonator, conventional support techniques have included various elastic clamping means at the periphery of the resonator where relative shear-motion quiescence occurs. These clamps have conventionally been wires, metallic ribbons, metallic springs, etc. Another conventional support technique has been to fashion the resonator and the resonator support from a single piece of quartz by chemical or mechanical machining methods.

U.S. Pat. No. 4,362,961 to Gerber discloses an encapsulated piezoelectric resonator device wherein a vibrating member and a frame member are formed integrally on a single substrate. The frame/resonator member is sandwiched between and bonded to two cover members which are positioned above and below the resonator member, respectively. The resonator member is connected to a number of electrodes and connection to the electrodes is provided by passages through the two cover members. This resonator operates in a flexure mode. The resonator member and the cover members are rigidly fixed together.

U.S. Pat. No. 4,234,811 to Hishida et al. discloses a supporting structure for a thickness-shear type crystal oscillator for watches wherein the supporting structure of a resonator element has a pair of flexible tongues to support the resonator element from both the top and the bottom of the resonator element. Additionally, another set of tongues is provided to engage notches on the resonator element's periphery to prevent lateral motion.

U.S. Pat. No. 3,988,621 to Nakayama et al. discloses an insulating ring with projections for supporting and rigidly clamping a quartz resonator. Electrodes are placed directly onto the shear-mode resonator and small wires electrically connect the electrodes to the insulating ring.

U.S. Pat. No. 2,002,167 to Beckmann discloses a crystal quartz resonator wherein capacitive coupling is used to excite the resonator. A support for the resonator is disclosed which uses notches and pins on the edge of the resonator.

U.S. Pat. No. 2,161,980 to Runge et al. discloses an elastically oscillating oscillator which uses a "wave reflection" phenomenon to produce a superior support structure for a vibrating member. A capacitively coupled drive structure in an evacuated enclosure to reduce deleterious air damping is disclosed.

U.S. Pat. No. 4,445,256 to Huguenin et al. discloses a method for manufacturing piezoelectric resonator components wherein the resonator is produced using "wafer level assembly" wherein a multiplicity of resonators are formed on a large quartz wafer. This quartz wafer has been welded to a top and bottom cover which are ceramic or glass.

U.S. Pat. Nos. 4,764,244 to Chitty et al. and 4,831,304 to Dorey et al. disclose a method of making a resonator, such as a sensor, which uses micro-machining technology.

U.S. Pat. No. 4,498,344 to Dinger discloses a resonating element that is subjected directly to external strains to effect a frequency change in the resonator resulting from a strain-dependent frequency sensitivity. The support material is selected to match the thermal expansion coefficient of the resonator.

U.S. Pat. No. 4,650,346 to Tehon uses a temperature-dependent-frequency resonator element to measure temperature which is similar to a temperature dependent thickness-shear mode resonator. However, Tehon teaches a torsional electromechanical method of mechanical excitation using propagating acoustic waves.

U.S. Pat. No. 4,735,103 to Mussard et al. describes a mounting concept meant to prevent undesirable stresses from being transmitted to the resonator. The invention as disclosed in this application does not utilize force sensitivity of frequency concept as taught by Mussard et al.

U.S. Pat. No. 4,861,168 to Zeigler et al. is a thermometer based on the conventional notion of a resonator with a temperature-dependent frequency. This patent teaches capacitively coupling a rotatable resonator through the walls of the separately enclosed resonator thereby allowing the resonator to be exposed to the thermal environment without so exposing the oscillator and associated electronics. Although this patent utilizes capacitive coupling, it includes mechanical rotatable coupling and requires thermal isolation of the electronics from the resonator, neither of which is disclosed in this invention.

U.S. Pat. No. 5,048,323 to Stansfield et al. describes a gas flow correction sensor for sensing a pressure temperature function of gas flowing in a line for use in correcting the output of a volumetric flow meter connected in the line. This patent incorporates a quartz crystal tuning fork resonator as a density sensitive detector wherein the resonator is operated in the pressure and temperature ambient experienced by the measured fluid and wherein this ambient causes a well known "density perturbation" of the resonator's frequency. This patent teaches away from the pressure induced diaphragm deflection and associated capacitance and oscillator frequency change constituting the pressure detection mechanism herein disclosed.

None of the existing remote devices operate in the megahertz range which results in a significant improvement in increasing the transmission range and miniaturization of the resonator. As a result, the resonator can operate in environments where it is not possible to operate with existing systems.

SUMMARY OF THE INVENTION (DISCLOSURE OF THE INVENTION)

In accordance with the invention, a micro-machined resonator-oscillator with an oscillation frequency of one (1) MHz and higher is disclosed. In addition, methods of using micro-miniature sensor beacons is disclosed for remote measurement of temperature, chemicals, acceleration and pressure. Additionally, the beacons can be used as a tag, microphone and a remote clock.

The preferred resonator-oscillator apparatus comprises a micro-machined resonator-oscillator with a frequency of oscillation of approximately one (1) MHz and higher; structure for activating said resonator-oscillator and an output apparatus. The preferred resonator-oscillator comprises a quartz resonator-oscillator. The preferred resonating apparatus comprises an oscillator circuit integrated into the resonator-oscillator.

The preferred resonator-oscillator comprises an apparatus for measuring. The preferred measuring apparatus comprises structure for quantifying the perturbance of a frequency of oscillation of the resonator-oscillator. The preferred structure for quantifying the perturbance comprises changing capacitance of an oscillator circuit.

The measuring apparatus can be an acceleration measurement apparatus. The preferred acceleration measurement comprises affixing a predetermined mass on a diaphragm. The measuring apparatus can also comprise a pressure measuring apparatus. The preferred pressure measuring apparatus comprises a diaphragm exposed to an environment to be measured. The measuring apparatus can comprise a chemical measurement apparatus. The preferred chemical apparatus comprises coating at least one vibrating surface of the resonator-oscillator with a chemically sensitive film. The measurement apparatus can comprise a temperature measurement apparatus. The preferred temperature measurement apparatus comprises a frequency temperature sensitive resonator plate.

The resonator-oscillator can further comprise a duty cycle structure. The resonator-oscillator further comprises an internal energy source or in the alternative, an external energy source.

The preferred output structure comprises radiated electro-magnetic energy. The preferred radiated electro-magnetic energy structure further comprises and antenna. The output structure can also comprise a sonic wave transmission. The output structure can also comprise a tag. An alternative output structure can comprise a clock.

The preferred method of utilizing a remote resonator-oscillator comprises providing a micro-machined resonator-oscillator with a frequency of oscillation of approximately one (1) MHz and higher; activating the resonator-oscillator and providing an output. The preferred step of providing a resonator-oscillator comprises providing a quartz resonator-oscillator. The preferred step of activating comprises integrating a circuit into the resonator-oscillator.

The preferred method for utilizing a remote resonator-oscillator comprises the step of measuring. The preferred step of measuring comprises quantifying a perturbance of a frequency of oscillation of the resonator-oscillator. The preferred step of quantifying a perturbance comprises changing a capacitance of an oscillator circuit.

The measuring step can comprise measuring acceleration. The preferred step of measuring acceleration comprises affixing a predetermined mass on a diaphragm. The step of measuring can also comprise measuring pressure. The preferred step of measuring pressure comprises exposing a diaphragm to an environment to be measured. The measuring step can also comprise measuring for a chemical. The preferred step of measuring for a chemical comprises coating at least one vibrating surface of the resonator-oscillator with a chemically sensitive film. The step of measuring can also comprise measuring a temperature. The preferred step of measuring a temperature comprises utilizing a frequency temperature sensitive resonator plate.

The preferred method of utilizing a remote resonator-oscillator can further comprise the step of utilizing a duty cycle. The method of utilizing a remote resonator-oscillator further comprises the step of utilizing an internal energy source or in the alternative an external energy source.

The preferred step of providing an output comprises providing radiated electro-magnetic energy. The preferred step of providing radiated electro-magnetic energy further comprises utilizing an antenna. The step of providing an output can also comprise utilizing sonic wave transmission. The step of providing an output can also comprise providing a tag. The step of providing an output can also comprise providing a clock.

The preferred method of measuring parameters and of providing for identification of an object comprises providing the apparatus of claim 1 to an object and generating an output. The preferred step of providing an apparatus comprises providing the apparatus to an animate object. The preferred step of generating an output comprises measuring parameters. The step of generating an output can also comprise sending data identifying the object. The step of generating an output can comprise at least one of the steps of identifying a tire, measuring a pressure of the tire, measuring a temperature of the tire and counting revolutions of the tire. The step of generating an output can also comprise at least one of the steps of measuring a pressure in a well, measuring acceleration in the well, measuring temperature in the well, and measuring chemicals in the well. The step of generating an output can also comprise monitoring a site for chemical quantification.

A primary object of the present invention is to provide a short-wavelength frequency-modulated radiating beacon structure for remote clocks, frequency sources and sensors.

Another object is to provide a digital, ultra-miniaturized, micro-machined sensor for widespread application.

Another object is to provide a family of robust, low-cost, batch-manufacturable sensors and clocks.

A primary advantage of the present invention is that a high-frequency resonator structure with integrated electronics affords a miniaturization capability not possible with low-frequency resonators.

Another advantage is that RF radiation transmission is more efficient at high-frequencies than at low-frequencies.

Another advantage of the present invention is the digital character of the measurand.

Still other advantages are robustness and low cost.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

Best Modes for Carrying Out the Invention

Now, with reference to the Figures, the preferred embodiments of the present invention will be described.

Figure 1:
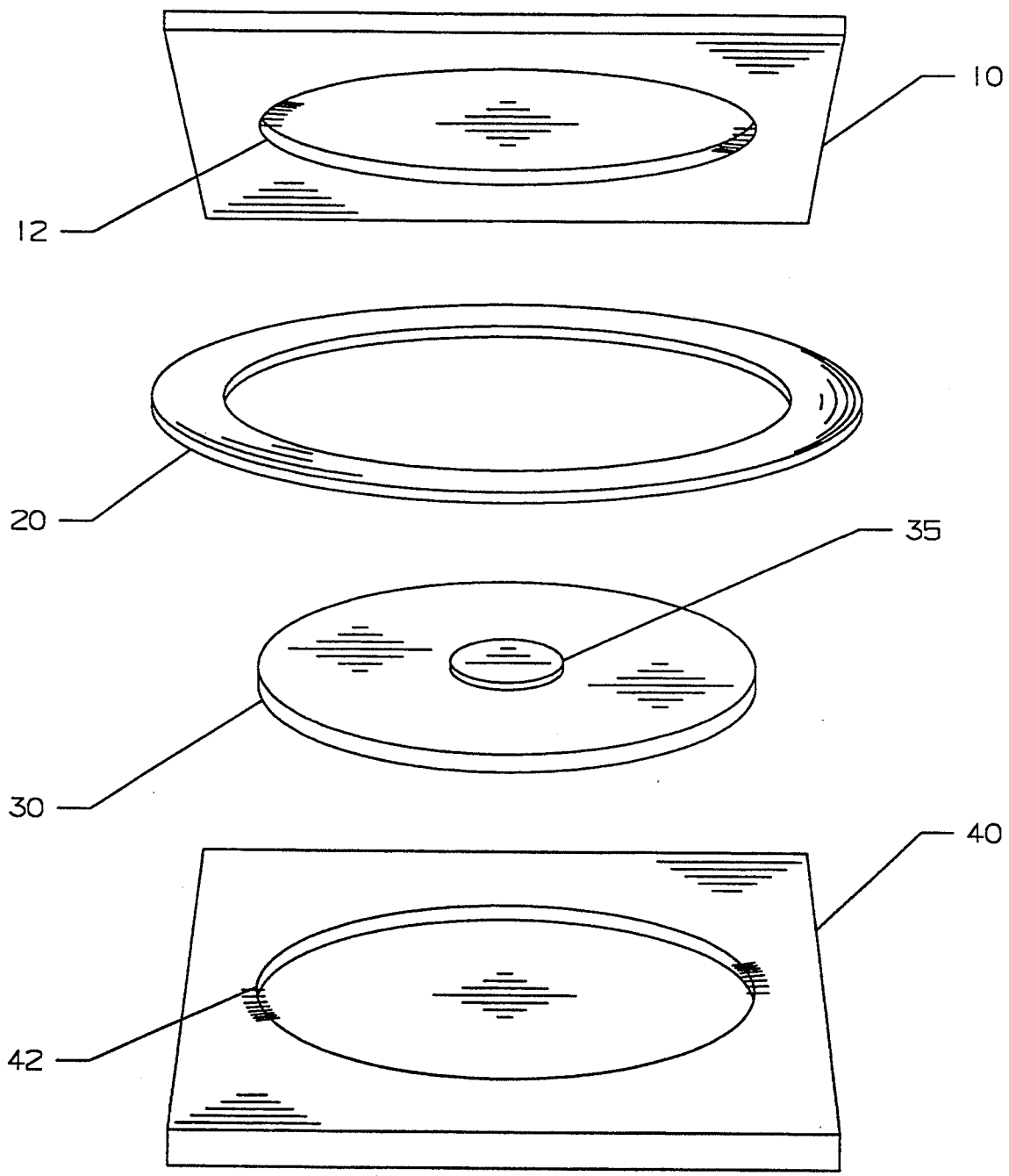
FIG. 1 is a perspective view of a micro-machined support structure for a quartz resonator.

With reference to FIG. 1, a three-dimensional view of a support structure for a quartz resonator of the present invention is shown. An upper support member 10 has an inner circular cut-out etched well area 12 into which a quartz resonator 30 fits. A spacer 20 fits around the periphery of the resonator 30 to provide additional space between the upper support member 10 and a lower support member 40. Alternatively, the spacer 20 and the quartz resonator 30 may be integrally fabricated from one piece of quartz. The upper and lower support members 10, 40, respectively, have been described as manufactured from silicon; however, other micromachinable materials such as glass, quartz and gallium arsenide may be used to fabricate the support members 10, 40. The lower support member 40 also has an inner cut-out etched well area 43 which accommodates the resonator 30 as well. The resonator 30 has an etched quartz mesa 35 which traps energy into a resonator 30 and makes the resonator 30 less sensitive to external perturbations at the resonator's periphery.

Figure 2:
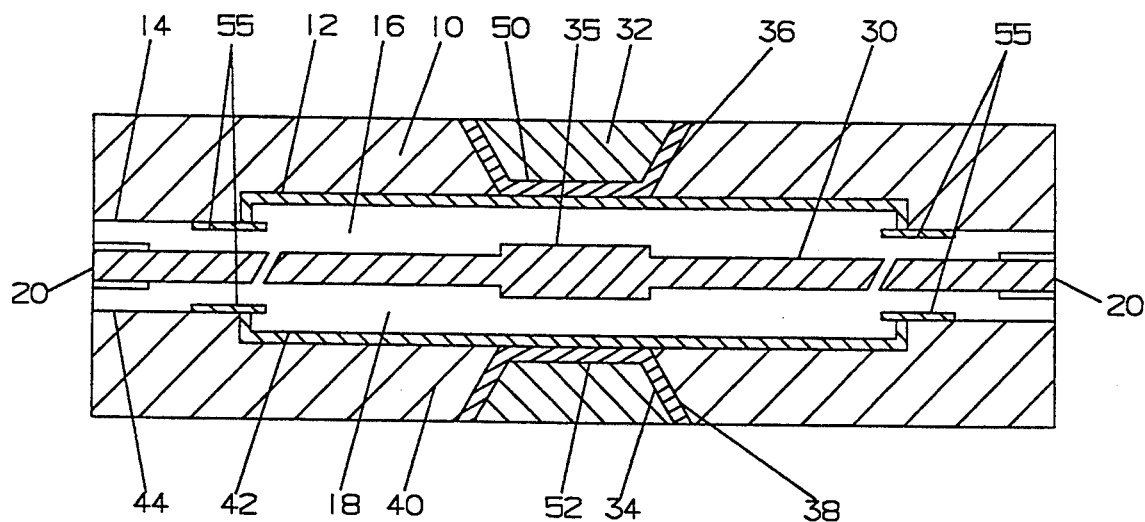
FIG. 2 is a side view of the micro-machined support structure for a quartz resonator of FIG. 1.

With reference to FIG. 2, a side view of the support structure for a quartz resonator of FIG. 1 will be described. The upper support member 10 and the lower support member 40 are shown separated to facilitate understanding, although the actual support structure is completely bonded together. The mesa 35 is located at the center of the resonator 30. The spacer 20 is located around the periphery of the resonator 30 and provides support to the resonator 30. The upper support member 10 is etched above the resonator 30 to form an upper well 32 whose walls and bottom are defined by an electrically active metallic layer, preferably aluminum, to form an upper electrode 36. A thin layer 50, which may be silicon dioxide or silicon nitride, lines the circular inner cut-out etched portion 12 of the upper support member 10 and extends across and is interposed between the upper electrode 36 and upper space 16. Similarly, a thin layer 52 lines the circular inner cutout etched portion 42 of the lower support member 40 and extends across and is interposed between the lower electrode 38 and lower space 18. Upper and lower electrodes 36, 38 are both connected to the same driving oscillator circuit (not shown).

Figure 3:
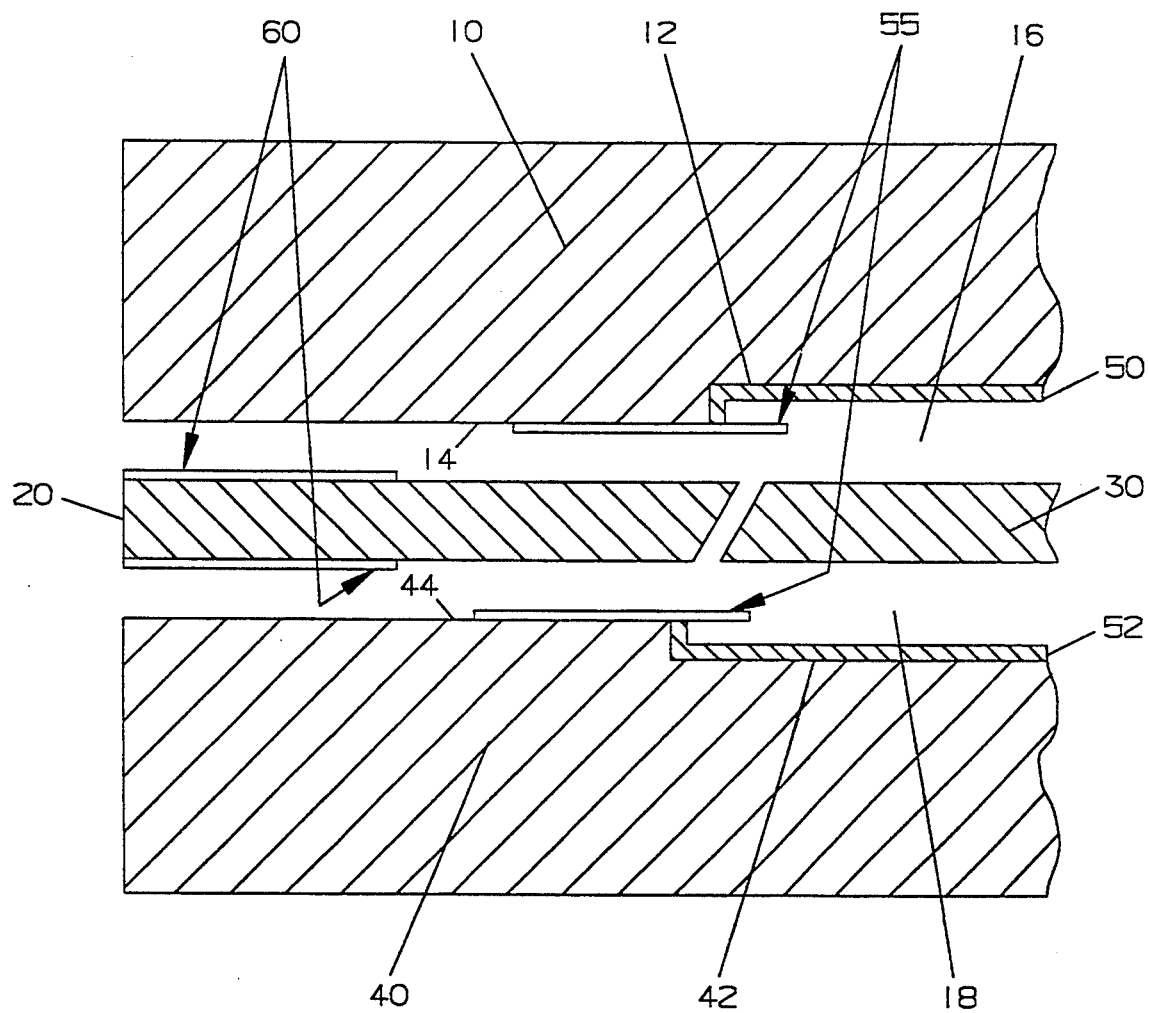
FIG. 3 is more detailed view of the edge of the micro-machined support structure for a quartz resonator of FIG. 2.

With reference to FIG. 3, a more detailed side view of the edge of the support structure of FIG. 2 will be described. The upper support member 10 and the lower support member 40 are shown. The circular inner cut-out etched portion 12 of the upper support member and the inner cut-out etched portion 42 of the lower support member, if fabricated from silicon, are coated with layers 50, 52 of silicon dioxide or silicon nitride. Layers 50, 52 provide an etch stop feature for electrode diaphragm fabrication and function as the diaphragm. The characteristics of the diaphragm layers 50, 52 which constitute the bottom or top layer of the etched upper and lower wells 32, 34, respectively, can be controlled. Precise frequency or clock applications are available if the layers 50, 52 are rigid. If, however, layers 50, 52 are flexible and sensitive to pressure or external forces, the invention herein may be used for transducer or sensor applications. The upper and lower support members 10, 40 may also each have a cantilever spring 55 which is deposited on an outer portion 14, 44 of the support member. The cantilever springs 55 overhang the cut-out portion 12, 42 of the support members. The cantilever springs 55 are deposited by and may be made of silicon dioxide, silicon nitride, or single crystal silicon. These cantilever springs 55 support the resonator 30 and allow it to be supported without any actual physical connection to the resonator 30 which would increase the sensitivity of the resonator 30 to external forces. Thus, the resonator 30 rests between the cantilever springs 55.

Once the support structure for the quartz resonator is bonded together, the upper and lower support members 10, 40 sandwich the spacer ring 20 and the resonator 30 in between them. To aid in this bonding, a layer 60, preferably of PYREX®, is first deposited on the surfaces of spacer ring 20 and subsequently is field assisted bonded to the edge of the support member surfaces 14, 44. This layer 60 is preferably as thick as the cantilever springs 55 so that when the spacer ring is bonded between upper and lower support members 10, 40, there is no free space between the two support members 10, 40 and the spacer 20. This provides a hermetic seal so that the enclosed area may be filled with a gas which improves the performance of the quartz resonator 30 by providing squeeze-film damping for shock and vibration absorption. Alternately, the hermetic seal may create an evacuated enclosure. Other alternative bonding techniques can be used, such as low-temperature thin-film metallic soldering, or the like.

Referring back to FIG. 2, capacitive coupling is achieved by virtue of the air gaps 16, 18 or any dielectric material between the resonator surface 35 and the upper and lower electrodes 36, 38. Although reference is made to the air gaps 16, 18, the space may be filled with an inert gas or may be a vacuum, and other intervening dielectric material. Although the upper and lower support structures 10, 40 are configured to provide insulating layers 50, 52, which may be silicon, as an intervening material, the support structures could be configured with no material between conducting electrodes 36, 38 and air gaps 16, 18, respectively. In the case which includes a dielectric layer, the capacitor is a composite of dielectric and air, while in the case which includes no dielectric, the capacitor is solely an air-gap capacitor.

The electrical effect of capacitive coupling is to present a reactive load, i.e., the coupling capacitor, in series with the quartz resonator 30 which in turn affects the mechanical motion of the resonator 30. The larger the value of the series capacitor the smaller will be the reactive impedance and the smaller will be its influence on the vibrating resonator. The primary effect is to shift the frequency of resonance or operation and a secondary effect is to reduce the driving efficiency. Should the coupling capacitor become too small, which may be associated with large air gaps, resonator excitation becomes impossible. Because the coupling capacitor depends on the thickness of the air-gap, any variation of this thickness will cause an associated operating frequency change; at most, this frequency change is of the order of hundreds to thousands of parts per million. As discussed earlier, the characteristics of the diaphragm layers 50, 52 can also be controlled to determine the function of the invention.

Figure 4:
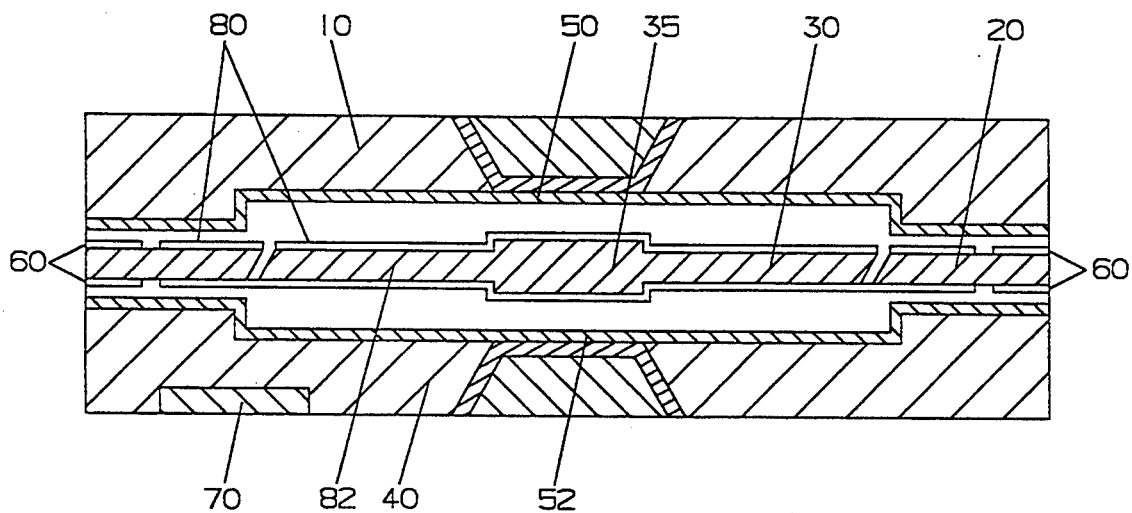
FIG. 4 is a side view of a support structure for a quartz resonator which is one preferred embodiment of the present invention.
Figure 5:
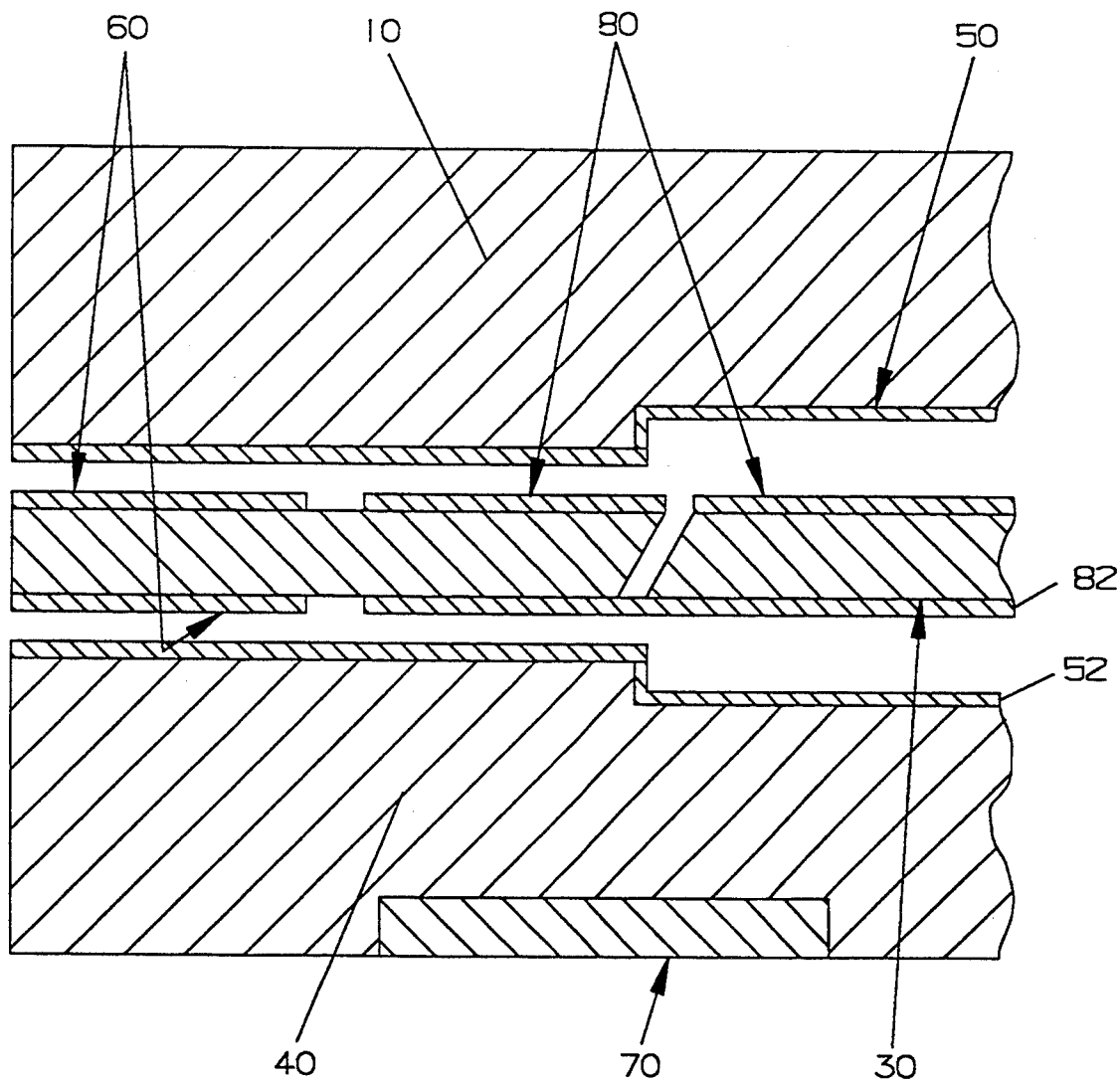
FIG. 5 is a more detailed side view of the edge of the support structure of FIG. 4.

With reference to FIGS. 4 and 5, another support structure for the quartz resonator will be described in accordance with another embodiment of the present invention. The resonator 30 in this embodiment also has the etched quartz mesa 35 as in the previous embodiment, but has a different type of support structure. Also, this embodiment includes oscillator and interface circuitry 70 integrally formed within the lower support member 40.

In this embodiment, layers 50, 52, which may be silicon dioxide or silicon nitride, are deposited over the entire surface of the upper support member 10 and the lower support member 40, respectively. A layer 80, which may also be silicon nitride, is deposited on top of the quartz resonator 30 and a certain predetermined distance on the spacer ring 20. On the bottom of the quartz resonator 30, a layer 82, of silicon nitride, extends from the resonator 30 across the gap between the resonator and the spacer ring 20 to a certain point on the spacer ring. The upper layer 80 has a gap in it corresponding to the gap between the resonator 30 and the spacer ring 20. The lower layer 82 provides support for the resonator 30 as the cantilever springs 55 did in the previous embodiment.

In order to ensure a hermetic seal between the upper support member 10 and the lower support member 40 and the spacer ring 20 which is sandwiched between them, a layer 60, which may be PYREX®, which has the same thickness as the layers 80, 82 is deposited on the edge portion of the spacer ring 20. Thus, when the entire structure is bonded together, no air gaps exist between the upper and the lower support members 10, 40 and the spacer ring 20.

Figure 6:
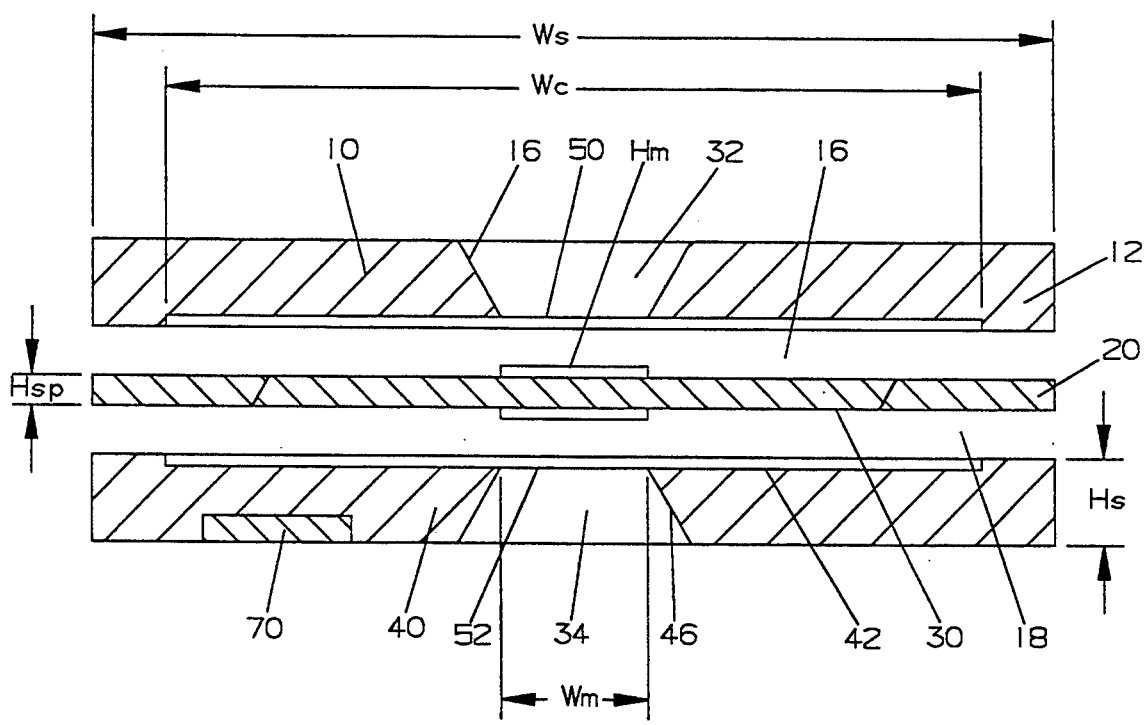
FIG. 6 is a side view of a support structure for quartz resonator in accordance with another embodiment of the present invention.
Figure 7:
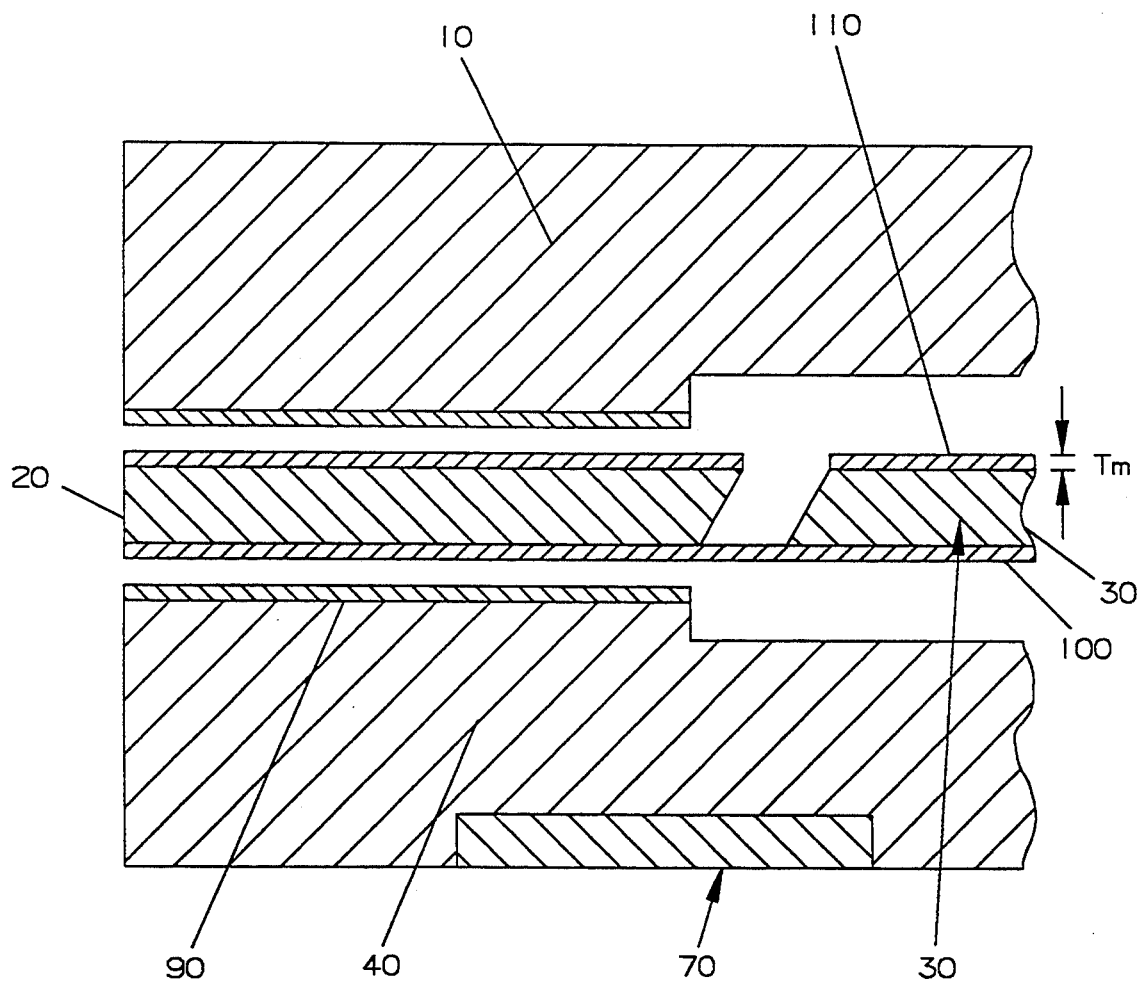
FIG. 7 is a more detailed side view of the edge of the support structure of FIG. 6.

With reference to FIGS. 6 and 7, another support structure for a quartz resonator in accordance with another embodiment of the present invention will be described. FIGS. 6 and 7 show a quartz resonator which has a quartz spacer 20. FIGS. 6 and 7 additionally show the dimensions of an exemplary quartz resonator and its support structure of the present invention. Both the upper support member 10 and the lower support member 40 have a height denoted by $H_s$, which usually is typical of commercially available substrate. Commercially available silicon typically has a thickness on the order of 250 microns. The critical dimension which determines the frequency of the vibrating quartz resonator is the sum of the height labeled $H_{sp}$, which is the height of the spacer 20 or resonator 30, both of which have a combined height labeled $H_{sp}$, and twice the height of mesa 35, $H_m$, in the center of the resonator 30. The frequency of the resonator is also influenced by the size of the air gaps 16, 18. To achieve quality resonance the lateral extent of the resonating region or the width, denoted by $W_h$, is optimized according to the thickness of the resonator, $H_{sp}+2H_m$, based on energy trapping principles. FIG. 6 illustrates this dimension as the bottom of the upper well 32 and the top of the lower well 34. The cut-out portions 12, 42 of the upper and lower support members 10, 40 have a width $W_c$ which is dependent upon $W_h$; and the upper and lower support members 10, 40 have a width $W_a$ dependent upon $W_c$.

With reference to FIG. 7, an edge view of the quartz resonator structure of FIG. 6 will be described. FIG. 7 shows the support structure for the resonator 30 and the spacer 20. In order to provide a hermetic enclosure for the resonator 30 and the spacer 20, a bond layer 90 is deposited on the outer portion 14, 44 of the support members and bonds the upper support member 10 and the lower support member 40 to the spacer 20. The top portion of the spacer 20 and the resonator 30 has an etch mask layer 110 deposited on top. There is a small gap in this mask 110 between the resonator 30 and the spacer 20. To support the resonator 30, a film layer 100, which may be silicon, is deposited along the bottom of the resonator 30 and across the gap and onto the bottom of the spacer 20. This provides the support for the resonator 30 which was previously supplied by the cantilever springs 55.

Figure 8:
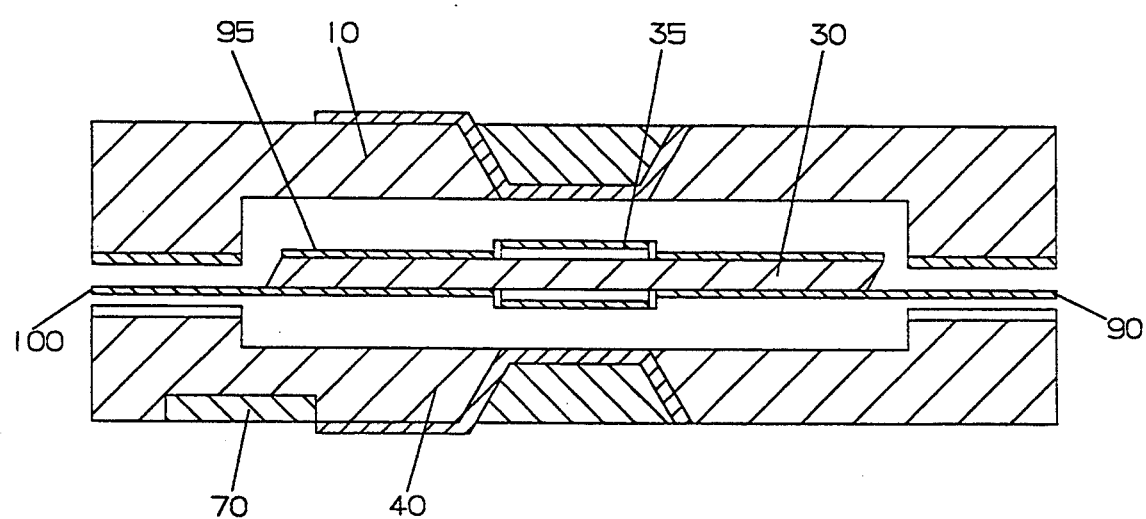
FIG. 8 is a side view of another support structure of a quartz resonator in accordance with another embodiment of the present invention.
Figure 9:
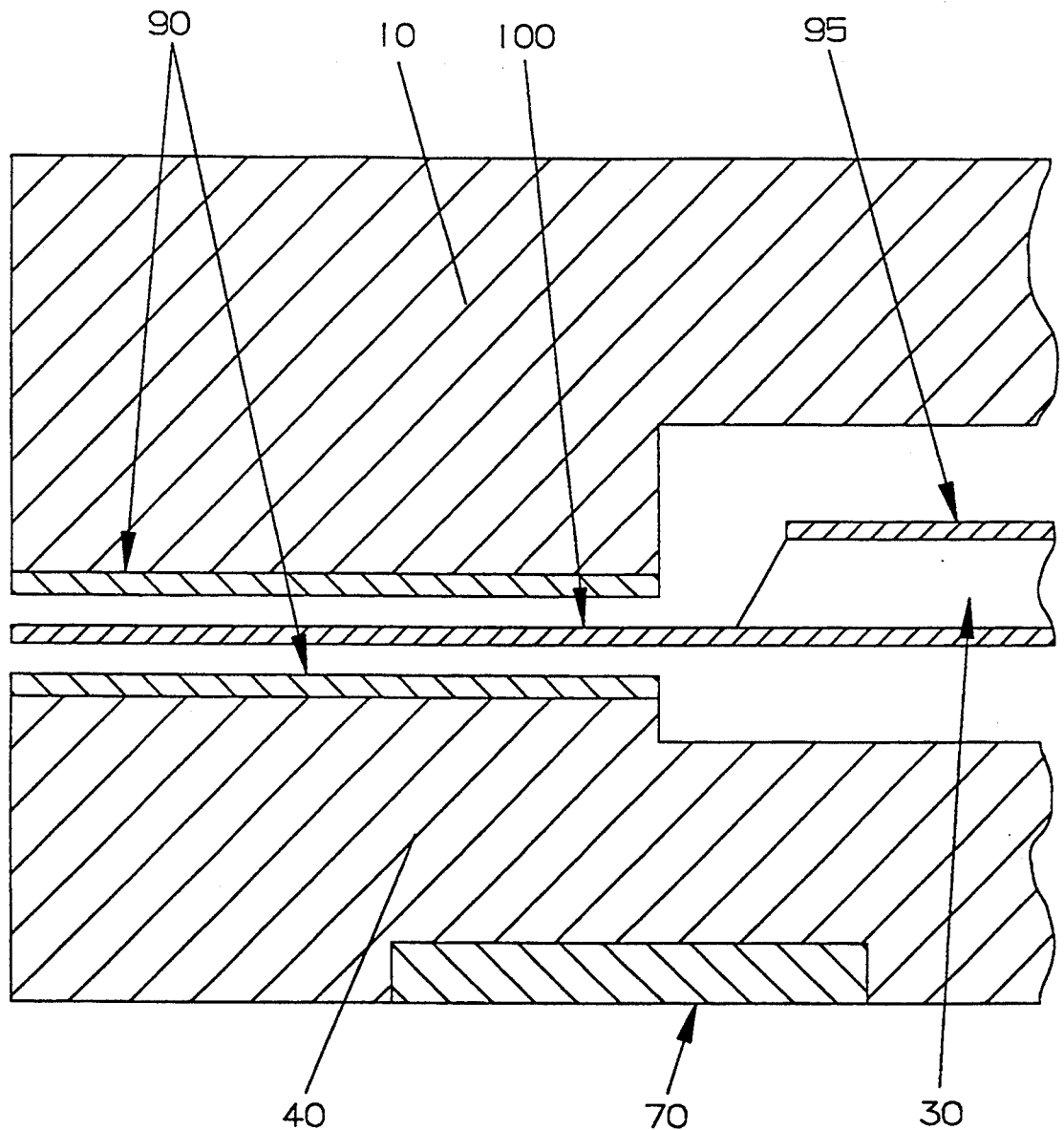
FIG. 9 is a more detailed side view of the edge of the support structure shown in FIG. 8.

With reference to FIGS. 8 and 9, anther embodiment of the present invention will be described wherein an integral spacer is used to support the resonator 30. In this embodiment, a bond layer 90 is coated onto the upper and lower support members 10 and 40. The oscillator and interface circuitry 70 is still present on the lower support member 40. The top of the resonator 30 is coated with a layer 95, which may be silicon. The lower surface of the resonator 30 is coated with another layer 100 which may be silicon and extends beyond the resonator to between the upper support member 10 and lower support member 40. Thus, the layer 100 is bonded between the upper support member 10 and the lower support member 40 by the bond layers 90 to provide a structure for supporting the resonator 30.

Figure 10:
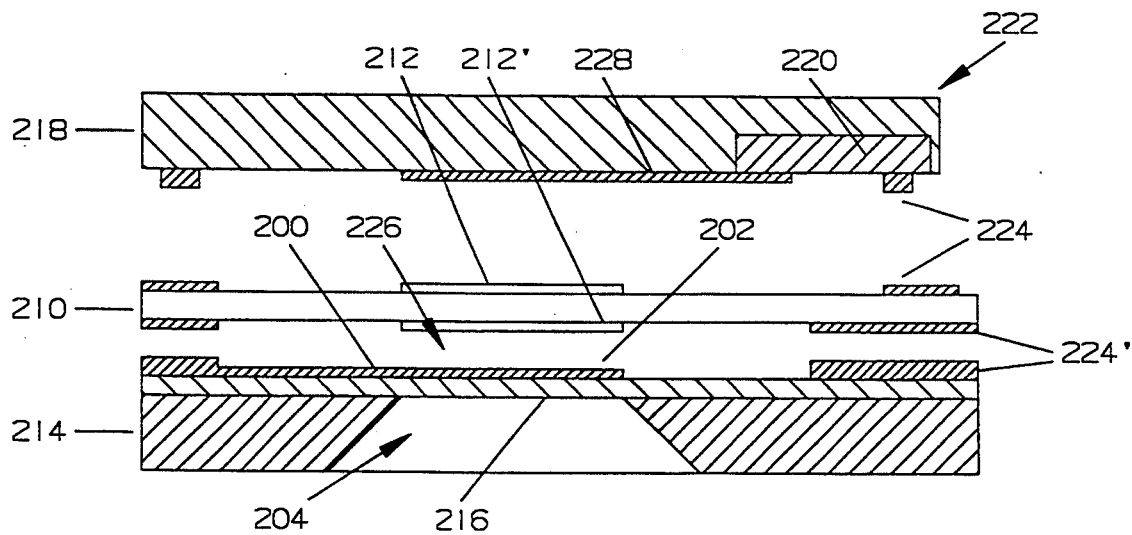
FIG. 10 is side view of the preferred pressure sensor embodiment.

The resonator-sensor concept disclosed above operates on the fact that the frequency of operation of a crystal controlled oscillator depends primarily on the resonant frequency of a mechanical resonator, but secondarily on the reactive elements of the exciting electronic circuitry constituting the driving oscillator for the mechanical resonator. If, as in the case of a quartz crystal resonator, the mechanical resonator is a stable element and is a low-loss, or high Q, device, then the oscillating frequency will also be very stable as determined by the resonator performance. The oscillator frequency will nevertheless be secondarily sensitive to perturbing elements such as capacitance changes in the oscillator circuit. Such sensitivity is utilized, for example, to make voltage controlled oscillators with voltage sensitive capacitors called varactors. In the present invention, for the pressure sensor (also microphone) and accelerometer, FIGS. 10 and 11, respectively, use is also made of a variable capacitance element, namely an air-gap capacitor. The air-gap capacitor is formed with one plate or electrode of the capacitor being in the form of a diaphragm coated with a metallic film. This diaphragm is exposed to the external environment and is distended when acted upon by external forces. Reference is made to FIG. 10 where electroded diaphragm 202 is constituted by elements 200 and 216. Electroded diaphragm 202 is suspended over well 204 in silicon cover 214. Electroded diaphragm 202 is one side of variable capacitor 208 in FIG. 14.

The resonator/oscillator structure illustrated in FIG. 10 consists of three elements: resonator plate 210 of quartz, or the like, with centrally located mesas 212 and 212' serving to restrict vibratory motion to the region under mesa 212'; bottom cover 214 supporting diaphragm 216 with electrode 200 and suspended over well 204; and top cover 218 containing integrated oscillator circuitry 220. The three levels (218, 210 and 214) of resonator structure 222 are adhesively bonded together with bonding layers 224 and 224'. Minute air gap 226 is formed between the surfaces of the bottom cover 214 and quartz resonator plate 210. Although quartz is not a conducting surface, diaphragm's 202 conducting film, referred to as first electrode 200, air-gap 226 and quartz plate 210 constitute a "composite quartz and air-gap" capacitor assembly with second capacitor electrode 228 being formed either on the top side of quartz plate 210 or on the adjacent surface of the top cover element 218.

Figure 11:
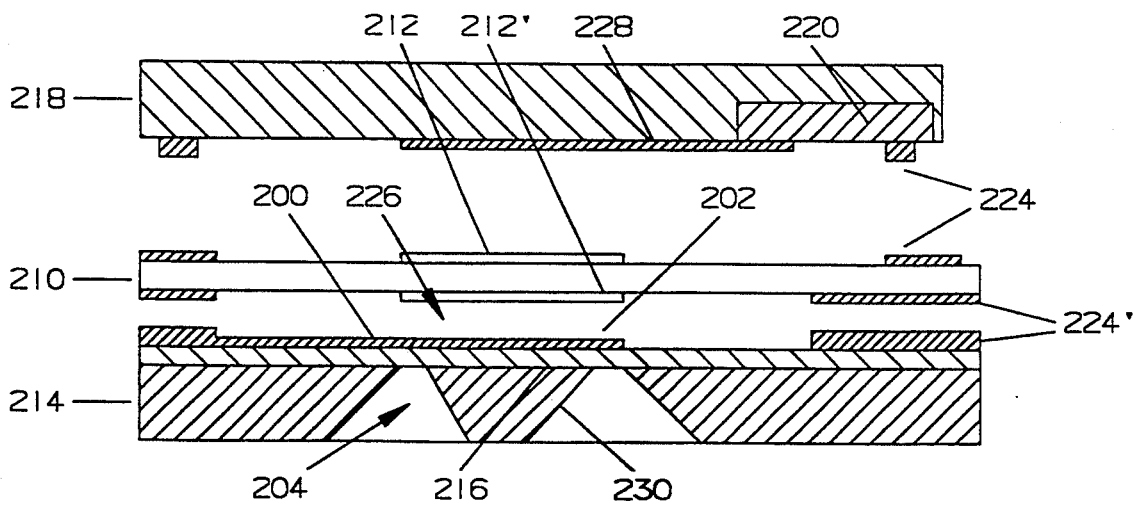
FIG. 11 is a side view of the preferred accelerometer embodiment.

The distending of diaphragm element 216 toward quartz plate 210, caused by either external pressure in the embodiment of FIG. 10 or acceleration of proof mass 230 in FIG. 11, will cause the variable air-gap capacitance to increase, thereby decreasing the oscillator's frequency.

Figure 12:
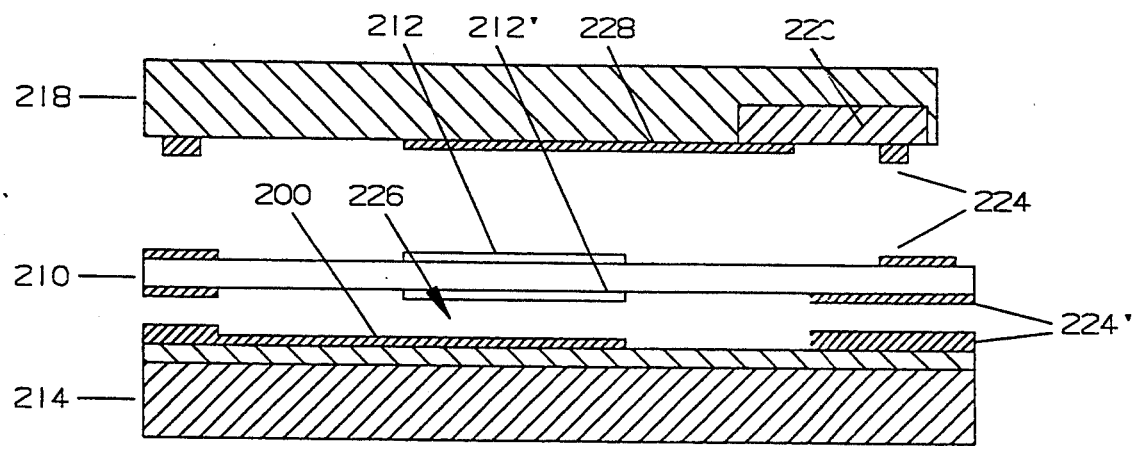
FIG. 12 is a side view of the preferred tag or thermometer embodiment.

A preferred thermometer realization is shown in FIG. 12 and does not require a variable air-gap capacitor although air-gap 226 is necessary. The temperature sensitivity arises from the inherent dependence of the quartz resonator's frequency on temperature, that is, the mechanical resonator's frequency is a function of its thickness and its mechanical coefficient of elasticity, both of which vary with temperature. This temperature sensitivity can be controlled by proper fabrication control of the quartz crystal's crystalline orientation and can be, for example, approximately 90 ppm/°C. Such a frequency dependence sensitivity is readily measurable and allows precise temperature measurement to approximately 0.001° C.

Figure 13:
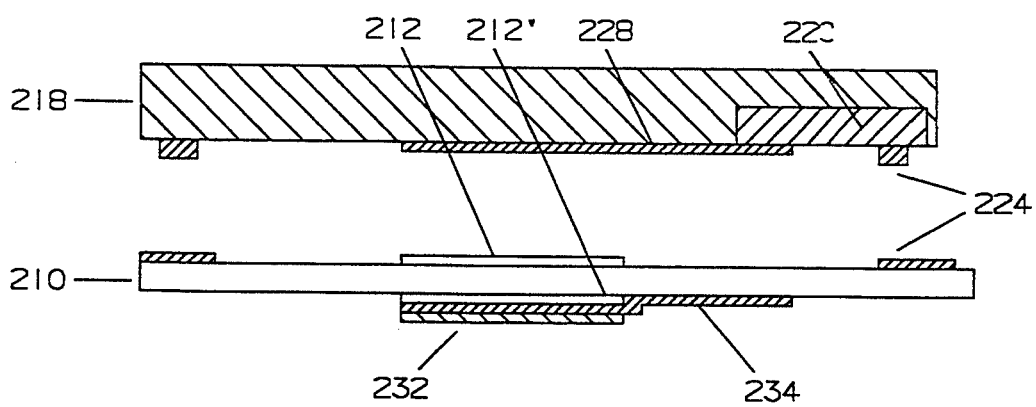
FIG. 13 is a side view of the preferred chemical sensor embodiment.

FIG. 13 displays the preferred micro-resonator chemical sensor. Bottom cover 214 of FIGS. 10, 11 and 12 has been eliminated to allow exposure of chemically sensitive film 232 to a chemical environment. Chemically sensitive film 232 is a species-specific chemical absorbing layer, or the like, and is deposited onto electrode layer 234 on quartz plate 210. As a chemical species is absorbed onto film 232, quartz resonator plate 210 is loaded and effectively changes its thickness thereby reducing its frequency of vibration.

Figure 14:
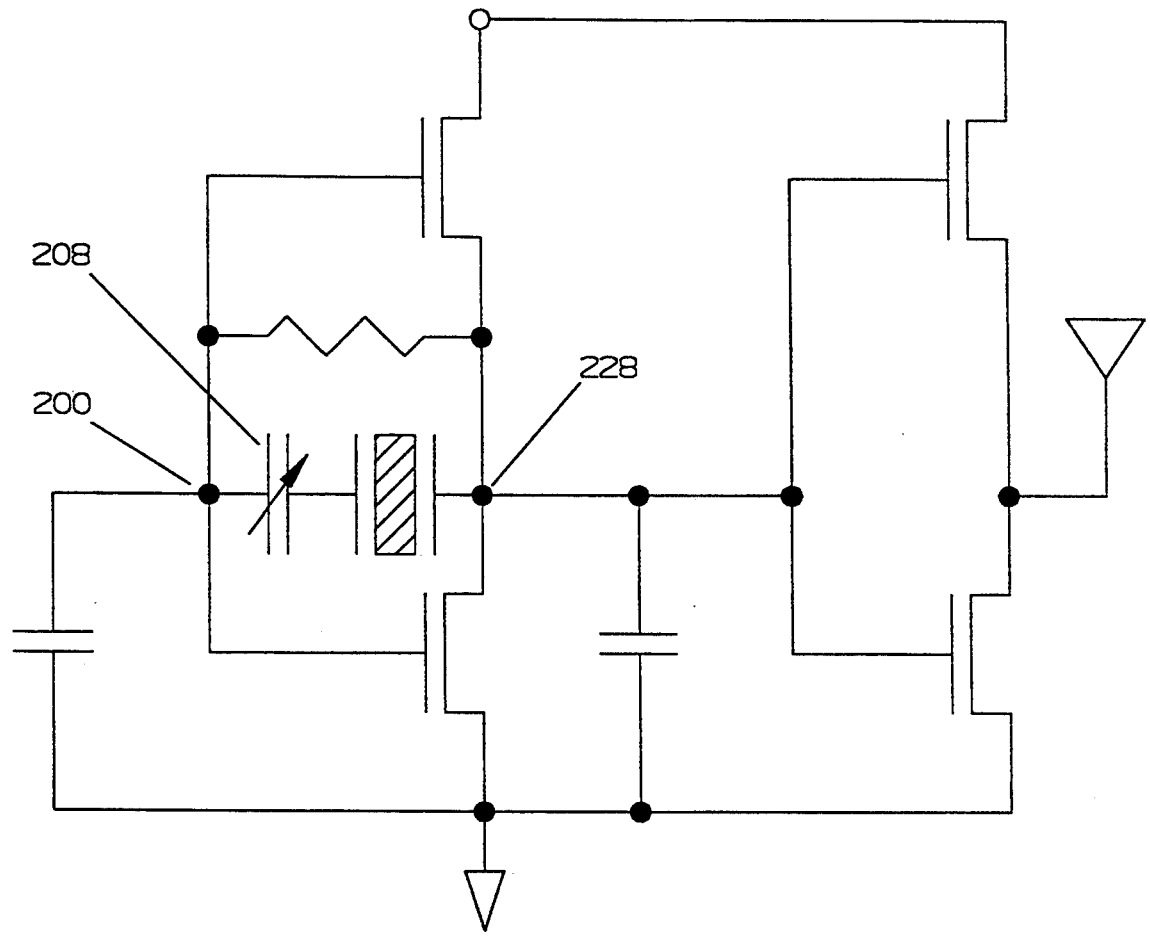
FIG. 14 is a schematic of the preferred oscillator/buffer embodiment.

In the preferred thermometer embodiment, as well as the pressure sensor, microphone, accelerometer and chemical sensor, the measuring device is transduced to a frequency change and transmitted by the oscillator electronics as a radiated RF frequency-modulated signal; the preferred oscillator electronics are shown in FIG. 14. The radiating antennas in such small structures are of necessity also small and are very inefficient in prior art systems. The efficiency is however a function of radiated wavelength and is greater for higher frequencies. In the present invention, the utilized frequencies are 1 MHz or greater which increases the overall efficiency of the systems.

A tag or identification function, as shown in FIG. 12, can be realized either as a unique identifying frequency, adjustable at manufacture, or as a digitally coded word transmitted according to a pre-determined time interval or on demand, given the proper receiving circuitry. This embodiment requires only an appropriate resonator-frequency determination or a unique electronic coding for individualization of the transmitted signal. This embodiment is constructed similarly to the thermometer embodiment.

Figure 15:
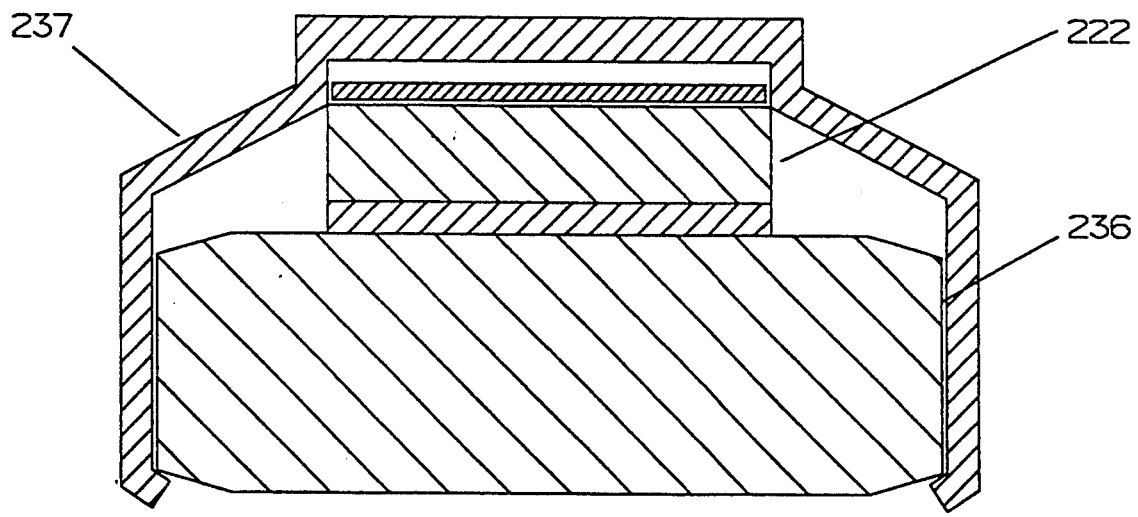
FIG. 15 is a front view of the preferred stand-alone beacon.
Figure 16:
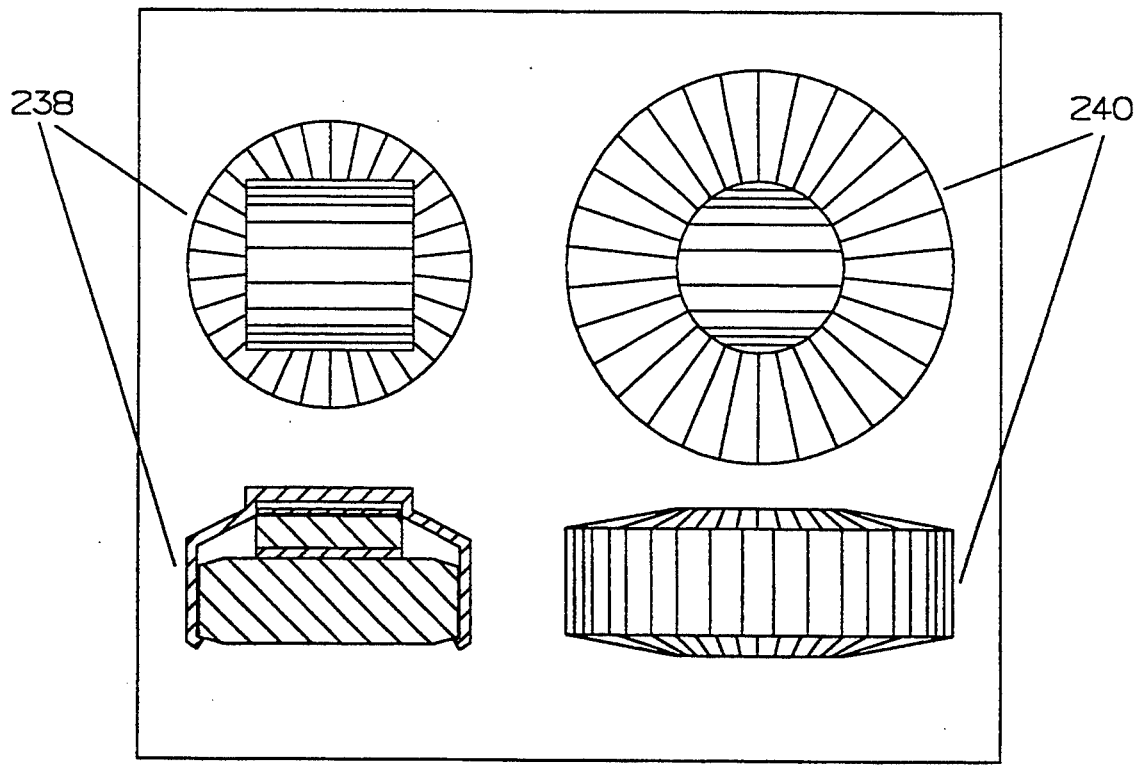
FIG. 16 is a size comparison of the preferred standalone beacon to an aspirin.

For stand-alone beacons, a local power source must be included in the structure and for passive designs (no local power source), a receiver must be incorporated into the sensor structure to receive power radiated from external RF or optical power sources to allow activation of the sensor or ID circuitry. FIG. 15 shows a preferred local power source embodiment affixed to a beacon. Cell 236, such as Panasonic SR626, is affixed to resonator structure 222 via attachment structure 237 as shown. A size comparison of the preferred stand alone beacon in FIG. 15 to an aspirin is shown in FIG. 16. Preferred stand alone beacon 238 typically has dimensions of 7.2 mm dia.×3.9 mm, or the like, while aspirin 240 typically has dimensions of 10.4 mm dia.×4.5 mm.

Figure 17:
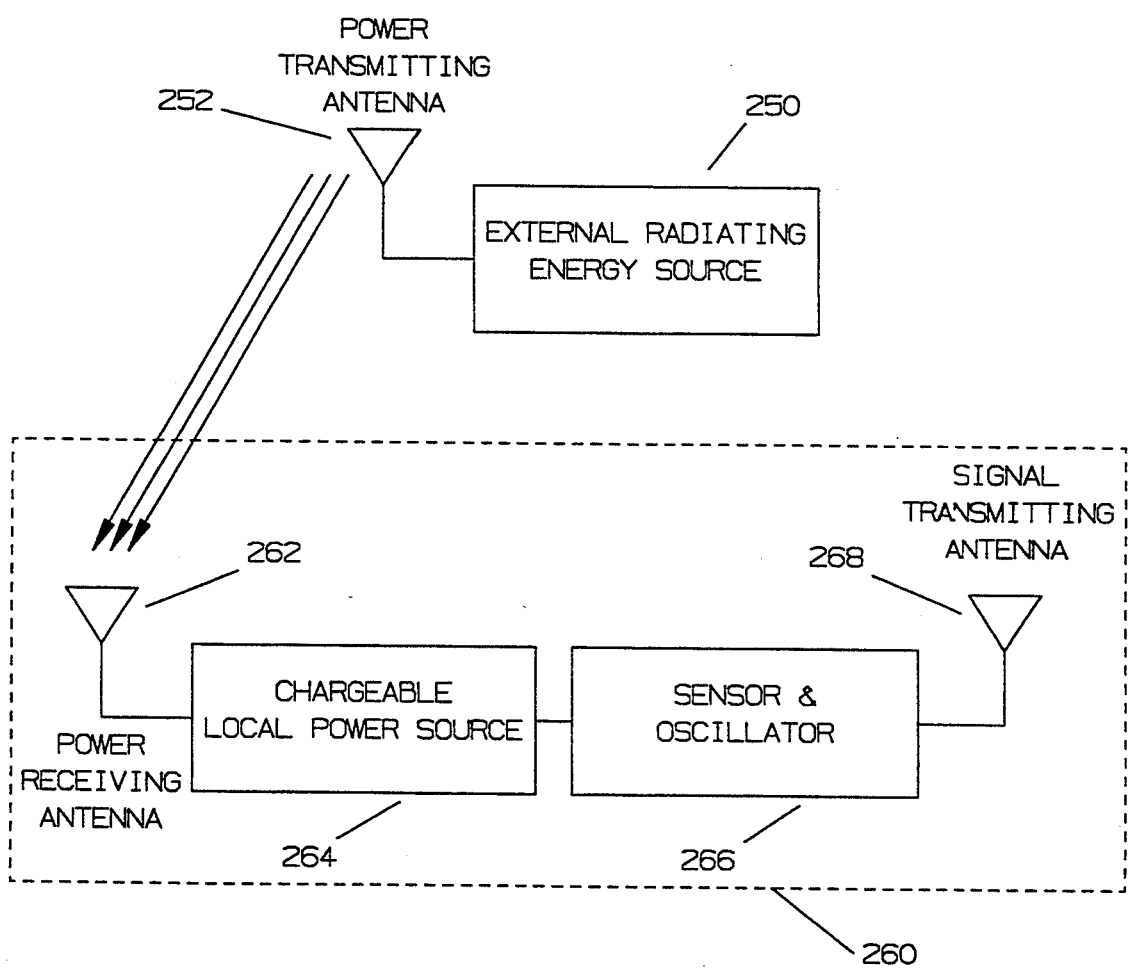
FIG. 17 is a diagram of the preferred passive beacon.
Figures 18, 19:
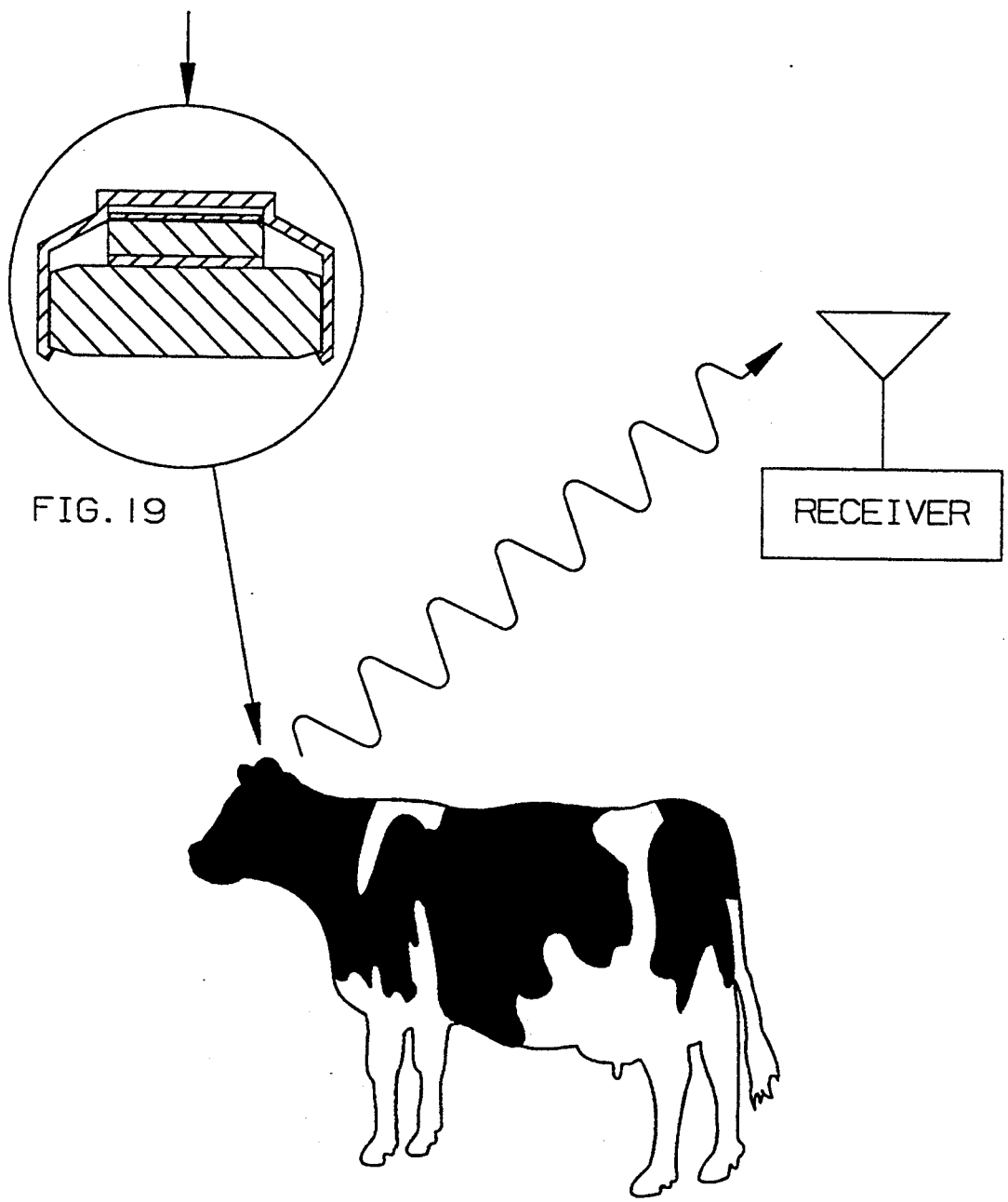
FIG. 18 illustrates the preferred method of using the thermometer and ID embodiment.
FIG. 19 is an enlarged view of the microchip shown in FIG. 18.
Figures 20, 21:
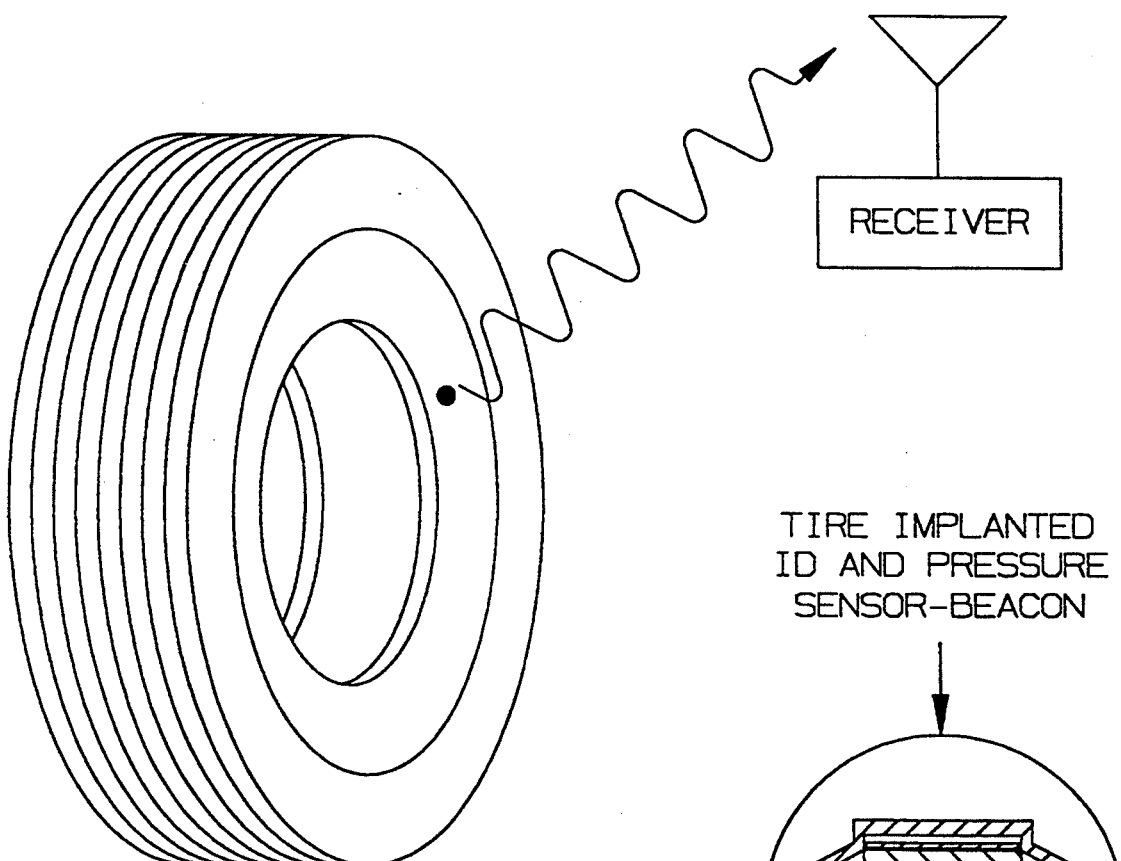
FIG. 20 illustrates the preferred method of using the pressure sensor embodiment.
FIG. 21 is an enlarged view of the microchip shown in FIG. 20.

A preferred passive beacon embodiment is shown in FIG. 17. Electromagnetic energy, either RF or optical, is radiated from energy source 250, via the power transmitting antenna 252, to a power receiving antenna 262 fabricated as part of sensor beacon system 260. The received electromagnetic energy is stored in local power source 264 using conventional electronic charging circuitry. The power storage element need only be a storage capacitor although electrochemical cells and other rechargeable storage means can be used. Sensor and oscillator 266 electrically feed the signal transmitting antenna 268 thereby completing the passive beacon system 260.

A classical application of ultra-miniature sensor telemetry is in the biomedical field where, for example, body core temperatures are monitored via ingestible sensor bio-pills. Additionally, blood pressure, pulse rate and respiration rate are examples of other parameters that can be measured or monitored utilizing this invention. In addition to ingestion, the sensors can be implanted or affixed to a certain part of a body. The present sensor family invention offers the opportunity to extend bio-measurement capabilities to include pressure, chemical, sound and acceleration, as well as the individualized identification or location functions. Thus, in addition to human uses, these sensors can be utilized for livestock, or the like. Additionally, applications have been established in the transportation field for pressure, temperature, acceleration and identification telemetry. An example for use of the sensor family in the transportation field is tire identification, pressure measurement, temperature measurement and revolution counting. The described sensors can also be useful in the energy sector. For example, remote pressure, acceleration, temperature and chemical measurements can be made in well logging operations. Environmental monitoring can also be performed, for instance, by site monitoring for chemical measurements. The weapons sector can also benefit from these sensors, for example, by weapon identification and location and also the sensors can be used for position sensing.

The beacon's signal transmitting antenna 268 is, of course, physically sized according to the sensor's dimensions, assuming no antenna is external to the beacon itself. Since the power radiated by an RF transmitter is inversely proportional to the square of the wavelength of the transmitted electromagnetic energy, higher frequencies are more efficiently transmitted by a physically constrained miniature dipole. However, reradiation by a secondary receiver/transmitter, external to the beacon, would allow a further increase in transmission range.

In addition to RF energy, other beacon-information transmitters can be incorporated into the beacon structure, such as optical radiation emitters, for example, including light emitting diodes and laser diodes. Also sonic emitters, such as miniature loudspeakers, could be added to the micro-machined remote sensor element to create an audible or supersonic signal.

Although the invention has been described with reference to these preferred embodiments, other embodiments can achieve the same results. Variations and modifications of the present invention will be obvious to those skilled in the art and it is intended to cover in the appended claims all such modifications and equivalents.

What is claimed is:

1. A resonator-oscillator apparatus, remote from a data receiving apparatus, comprising:
   a micro-machined housing comprising a resonator-oscillator means with a frequency of oscillation of greater than approximately one (1) MHz;
   means for activating a power source of said resonator-oscillator means; and
   sensor apparatus output means.

2. The invention of claim 1 wherein said resonator-oscillator means comprises quartz resonator-oscillator means.

3. The invention of claim 1 wherein said activating means comprises circuit means fabricated into said resonator-oscillator means.

4. The invention of claim 1 further comprising measuring means comprising means for changing a frequency of said resonator-oscillator means caused by environmental changes to said resonator-oscillator means.

5. The invention of claim 4 wherein said measuring means comprises means for quantifying a perturbance of a frequency of oscillation of said resonator-oscillator means.

6. The invention of claim 5 wherein said means for quantifying a perturbance comprises means for changing a capacitance of an oscillator circuit.

7. The invention of claim 4 wherein said measuring means comprises acceleration measurement means.

8. The invention of claim 7 wherein said acceleration measurement means comprises means for affixing a predetermined mass on a diaphragm means.

9. The invention of claim 4 wherein said measuring means comprises pressure measurement means.

10. The invention of claim 9 wherein said pressure measurement means comprises a diaphragm means exposed to an environment to be measured.

11. The invention of claim 4 wherein said measuring means comprises chemical measurement means.

12. The invention of claim 11 wherein said chemical measurement means comprises means for coating at least one vibrating surface of said resonator-oscillator means with a chemically sensitive film.

13. The invention of claim 4 wherein said measuring means comprises temperature measurement means.

14. The invention of claim 13 wherein said temperature measurement means comprises a frequency-temperature sensitive resonator plate means.

15. The invention of claim 1 wherein said means for activating further comprises means for activating said power source on a duty cycle.

16. The invention of claim 1 further comprising an energy source affixed to said resonator-oscillator means.

17. The invention of claim 1 further comprising an external energy source independent of said resonator-oscillator means.

18. The invention of claim 1 wherein said sensor apparatus output means comprises means for radiating electro-magnetic energy.

19. The invention of claim 18 wherein said means for radiating electro-magnetic energy further comprises antenna means.

20. The invention of claim 1 wherein said sensor apparatus output means comprises sonic wave transmission means.

21. The invention of claim 1 wherein said sensor apparatus output means comprises tag means.

22. The invention of claim 1 wherein said sensor apparatus output means comprises clock means.

23. A method of utilizing a resonator-oscillator remote from a data receiving apparatus, the method comprising the steps of:
   a) providing a micro-machined housing comprising a resonator-oscillator with a frequency of oscillation of greater than approximately one (1) MHz to an object;
   b) activating a power source of the resonator-oscillator; and
   c) providing a sensor apparatus output.

24. The method of claim 23 wherein the step of providing a micro-machined housing comprising a resonator-oscillator to an object comprises providing a quartz resonator-oscillator.

25. The method of claim 23 wherein the step of activating a power source comprises integrating a power source circuit into the resonator-oscillator.

26. The method of claim 23 further comprising the step of measuring a change in frequency of the resonator-oscillator caused by environmental changes to the resonator-oscillator.

27. The method of claim 26 wherein the step of measuring comprises quantifying a perturbance of a frequency of oscillation of the resonator-oscillator.

28. The method of claim 27 wherein the step of quantifying a perturbance comprises changing a capacitance of an oscillator circuit.

29. The method of claim 26 wherein the step of measuring comprises measuring acceleration.

30. The method of claim 29 wherein the step of measuring acceleration comprises affixing a predetermined mass on a diaphragm.

31. The method of claim 26 wherein the step of measuring comprises measuring pressure.

32. The method of claim 31 wherein the step of measuring pressure comprises exposing a diaphragm to an environment to be measured.

33. The method of claim 26 wherein the step of measuring comprises measuring for a chemical.

34. The method of claim 33 wherein the step of measuring for a chemical comprises coating at least one vibrating surface of the resonator-oscillator with a chemically sensitive film.

35. The method of claim 26 wherein the step of measuring comprises measuring a temperature.

36. The method of claim 35 wherein the step of measuring a temperature comprises utilizing a frequency-temperature sensitive resonator plate.

37. The method of claim 23 wherein the step of activating a power source comprises activating the power source on a duty cycle.

38. The method of claim 23 further comprising the step of utilizing an internal energy source affixed to the resonator-oscillator.

39. The method of claim 23 further comprising the step of utilizing an external energy source independent of the resonator-oscillator.

40. The method of claim 23 wherein the step of providing a sensor apparatus output comprises providing radiated electro-magnetic energy.

41. The method of claim 40 wherein the step of providing radiated electro-magnetic energy further comprises utilizing an antenna.

42. The method of claim 23 wherein the step of providing a sensor apparatus output comprises utilizing sonic wave transmission.

43. The method of claim 23 wherein the step of providing a sensor apparatus output comprises providing a tag.

44. The method of claim 23 wherein the step of providing a sensor apparatus output comprises providing a clock.

45. A method of measuring parameters of and providing for identification of an object, the method comprising the steps of:
   a) providing the apparatus of claim 1 to an object;
   b) generating an output from the apparatus indicating at least one predetermined parameter.

46. The method of claim 45 wherein the step of providing an apparatus comprises providing the apparatus to an animate object.

47. The method of claim 45 wherein the step of generating an output comprises measuring parameters.

48. The method of claim 45 wherein the step of generating an output comprises sending data identifying the object.

49. The method of claim 45 wherein the step of generating an output comprises at least one of the following steps:
   a) identifying a tire;
   b) measuring a pressure of the tire;
   c) measuring a temperature of the tire; and
   d) counting revolutions of the tire.

50. The method of claim 45 wherein the step of generating an output comprises at least one of the following steps:
   a) measuring a pressure in a well;
   b) measuring acceleration in the well;
   c) measuring temperature in the well; and
   d) measuring chemicals in the well.

51. The invention of claim 45 wherein the step of generating an output comprises monitoring a site for chemical quantification.

* * * * *